(12) United States Patent
Kwon et al.

(10) Patent No.: US 10,028,375 B2
(45) Date of Patent: Jul. 17, 2018

(54) FINGERPRINT SENSING DEVICE

(71) Applicant: Samsung Electronics Co., Ltd., Suwon-si, Gyeonggi-do (KR)

(72) Inventors: Yong Il Kwon, Suwon-si (KR); Tah Joon Park, Suwon-si (KR); Joon Seok Chae, Suwon-si (KR); Jong Woo Choi, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 84 days.

(21) Appl. No.: 15/177,805

(22) Filed: Jun. 9, 2016

(65) Prior Publication Data

US 2017/0154201 A1    Jun. 1, 2017

(30) Foreign Application Priority Data

Nov. 27, 2015    (KR) .................. 10-2015-0167564

(51) Int. Cl.
| | |
|---|---|
| *H05K 1/18* | (2006.01) |
| *H05K 1/02* | (2006.01) |
| *H05K 1/14* | (2006.01) |
| *H05K 1/11* | (2006.01) |
| *H05K 1/09* | (2006.01) |
| *G06K 9/00* | (2006.01) |

(52) U.S. Cl.
CPC ......... *H05K 1/0271* (2013.01); *G06K 9/0002* (2013.01); *H05K 1/09* (2013.01); *H05K 1/112* (2013.01); *H05K 1/144* (2013.01); *H05K 1/183* (2013.01); *H05K 2201/049* (2013.01); *H05K 2201/10151* (2013.01)

(58) Field of Classification Search
USPC ......................................... 361/761, 760, 748
See application file for complete search history.

(56) References Cited

U.S. PATENT DOCUMENTS

| | | | |
|---|---|---|---|
| 8,866,347 B2 | 10/2014 | Benkley, III | |
| 2006/0140458 A1* | 6/2006 | Cheng | G06K 9/00026 382/124 |
| 2008/0157301 A1 | 7/2008 | Ramakrishna et al. | |
| 2015/0102829 A1 | 4/2015 | Son et al. | |
| 2017/0012142 A1* | 1/2017 | Lin | G06K 9/00053 |

FOREIGN PATENT DOCUMENTS

| | | |
|---|---|---|
| KR | 10-2013-0127739 A | 11/2013 |
| KR | 10-2015-0016028 A | 2/2015 |
| KR | 10-2015-0059341 A | 6/2015 |

* cited by examiner

*Primary Examiner* — Andargie M Aychillhum
(74) *Attorney, Agent, or Firm* — F. Chau & Associates, LLC

(57) ABSTRACT

A fingerprint sensing device includes a board having a sensor array, a sub-board disposed on a bottom surface of the board, a circuit element disposed on the bottom surface of the board, and a through hole disposed through the sub-board, wherein the circuit element is further disposed in the through hole. A thickness of the sub-board is substantially similar to a thickness of the circuit element.

18 Claims, 4 Drawing Sheets

FINGERPRINT SENSING DEVICE

CROSS-REFERENCE TO RELATED APPLICATION

This application claims the benefit under 35 USC § 119(a) of Korean Patent Application No. 10-2015-0167564 filed on Nov. 27, 2015, with the Korean Intellectual Property Office, the entire disclosure of which is incorporated herein by reference for all purposes.

BACKGROUND

1. Field

The following description relates to a fingerprint sensing device.

2. Description of Related Art

Recently, mobile devices such as smartphones, tablet PCs, and laptop computers, have become prevalent, and as Internet of Things (IoT) technologies, establishing networks by coupling various electronic devices to mobile devices has been developed, research into security-related technologies has been actively conducted.

An existing scheme of using a password or a pattern lock scheme to lock a device may be an easy solution to protect information on the device. However, passwords or pattern locks may be vulnerable to hacking. In order to overcome such shortcomings of the schemes, various types of biometric authentication equipment have recently been developed.

Among the types of biometric authentication equipment, a fingerprint sensing scheme has been advantageously developed and applied to various mobile devices. When a user applies a fingerprint to a fingerprint sensing device, the fingerprint sensing device detects an electrical signal generated by the contacting fingerprint to generate fingerprint data, and compares the generated fingerprint data with previously stored fingerprint data to authenticate the user.

Recently, as fingerprint sensing devices have been applied to mobile devices, various methods for achieving a thinner fingerprint sensing device have been studied.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a fingerprint sensing device includes a board having a sensor array, a sub-board disposed on a bottom surface of the board, a circuit element disposed on the bottom surface of the board, and a through hole disposed through the sub-board, wherein the circuit element is further disposed in the through hole. A thickness of the sub-board is substantially similar to a thickness of the circuit element.

The sub-board may have a circular shape and may include a bottom electrode configured to receive solder.

The sub-board may include a circular ring portion and an extending portion extending from one end of the ring portion. A connection terminal configured to connect to a main board may be disposed on the extending portion. The sub-board may further include a via formed in the ring portion and a circuit pattern connecting the via to the connection terminal.

The circuit component and the sub-board may be connected to the board through a connection member. The connection member may be formed of copper.

The sensor array may include first and second electrodes disposed in a base layer.

The board may include a first insulating layer disposed on a lower surface of the base layer and a second insulating layer disposed on an upper surface of the base layer. A first circuit pattern may be formed between the first insulting layer and the lower surface of the base layer, and a second circuit pattern may be formed between the second insulating layer and the upper surface of the base layer. An opening in the first insulating layer may expose a portion of the first circuit pattern, and the circuit element and the sub-board may be connected to the portion of first circuit pattern.

In another general aspect, a fingerprint sensing device includes a sensor array disposed in a base layer of a board, a sub-board disposed on the board, wherein the sub-board includes a through hole, and a circuit element disposed in the through hole and on the board. A thickness of the circuit element is substantially the same as a thickness of the sub-board. The sensor array includes a first electrode and a second electrode disposed in the base layer. The board includes a first insulating layer, the base layer disposed on the first insulating layer, and a second insulating layer disposed on the base layer. A first circuit pattern is disposed between the first insulating layer and the base layer, and a second circuit pattern is disposed between the base layer and the second insulating layer.

The circuit element and the sub-board may be connected to the first circuit pattern and the second circuit pattern through a connection member, and the connection member may be disposed within an opening formed in the first insulating layer.

The sub-board may have an annular shape and a bottom electrode configured to receive solder.

The sub-board may include a ring portion having an annular shape and an extending portion extending from one end of the ring portion, and a connection terminal configured to connect to a main board disposed on the extending portion. The fingerprint sensing may further include a connection member connecting the first and second circuit patterns to the connection terminal. A via may connect the connection member to the connection terminal. A circuit pattern may connect the via to the connection terminal.

The circuit element may be an integrated circuit driving chip.

The sub-board may include a printed circuit board configured to prevent bowing of the board.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
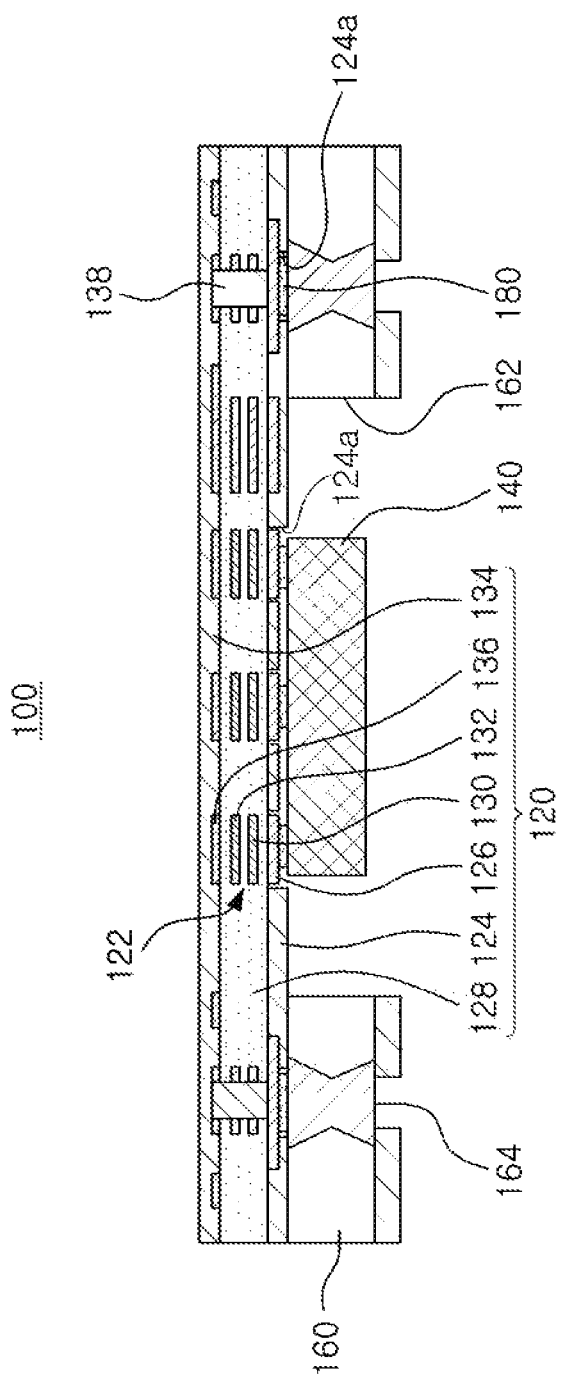
FIG. 1 is a schematic cross-sectional view illustrating a fingerprint sensing device according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

The terminology used herein is for describing particular embodiments only and is not intended to be limiting of the present disclosure. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

Figure 2:
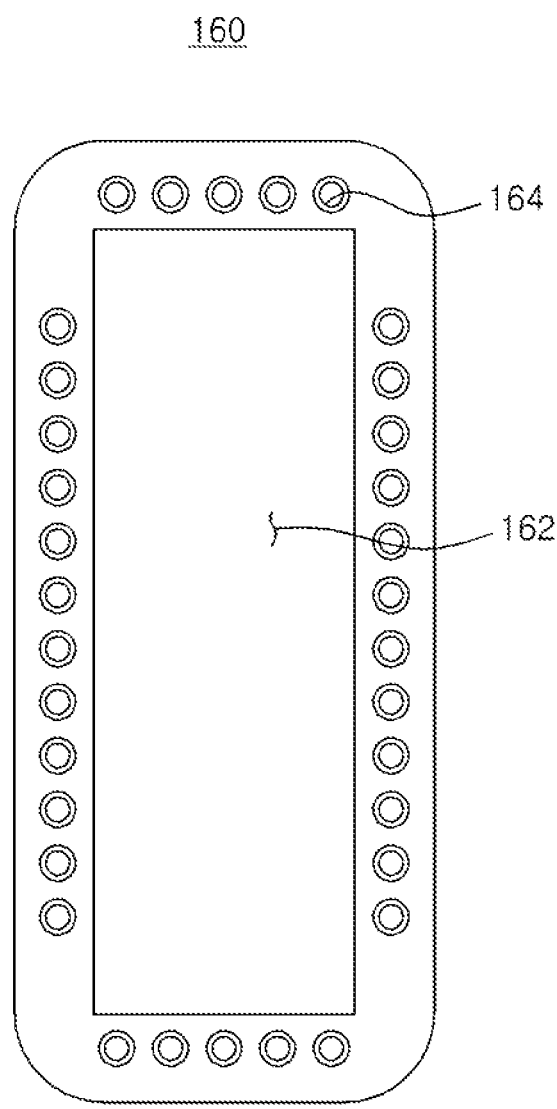
FIG. 2 is a bottom view illustrating a sub-board of a fingerprint sensing device according to an embodiment.

FIG. 1 is a schematic cross-sectional view illustrating a fingerprint sensing device according to an embodiment, and FIG. 2 is a bottom view illustrating a sub-board of a fingerprint sensing device according to an embodiment;

Referring to FIGS. 1 and 2, a fingerprint sensing device 100 according to an embodiment includes a board 120, a circuit element 140, and a sub-board 160.

The board 120 has a sensor array 122. The sensor array 122 may be configured as a board-type fingerprint sensor formed on the board 120. The board 120 also has a first insulting layer 124, a first circuit pattern 126, a base layer 128, a first electrode 130, a second electrode 132, a second insulating layer 134, and a second circuit pattern 136.

The first insulating layer 124 is disposed on the lowermost portion of the board 120 and formed of a solder resist layer. For example, the first insulating layer 124 may have a thickness of about 5 μm. Also, the first circuit pattern 126 is formed on the first insulating layer 124, and an opening 124a exposing a portion of the first circuit pattern 126 is formed in the first insulating layer 124. The first circuit pattern 126 exposed through the opening 124a is electrically connected to the circuit element 140 or/and the sub-board 160. The first circuit pattern 126 may have a thickness of about 0.2 μm.

The base layer 128 is disposed on the first insulating layer 124, and first and second electrodes 130 and 132 of the sensor array 122 are disposed in the base layer 128. The first electrode 130 is disposed in a lower portion of the base layer 128 as compared to a position of the second electrode 132. The first electrode 130 may include a plurality of first electrodes 130 extending along the lower portion of the base layer 128. The second electrode 132 is disposed in an upper portion of the base layer 128 as compared to the position of the first electrode 130. The second electrode 132 may include a plurality of second electrodes 132 extending along the upper portion of the base layer 128. That is, the first and second electrodes 130 and 132 are spaced apart from one another at a predetermined interval in a thickness direction of the board 120.

For example, the plurality of first and second electrodes 130 and 132 are electrically separate and extend in directions perpendicular to one another. That is, the plurality of first and second electrodes 130 and 132 form a lattice pattern. In addition, a wiring pattern 138 connects an outer side of the plurality of first and second electrodes 130 and 132, and connects the plurality of first and second electrodes 130 and 132 to the first and as 126 and 136. For example, the first and second electrodes 130 and 132 may have a thickness of about 0.2 μm. The base layer 128 may have a thickness of about 10 μm.

The second insulating layer 134 is disposed on top of the base layer 128, and the second circuit pattern 136 is formed on the second insulating layer 134. Also, the second insulating layer 134 may be a solder resist layer. For example, the second insulating layer 134 may have a thickness of about 5 μm. The second circuit pattern 136 may have a thickness of about 0.2 μm.

The board 120 is a coreless board. Thus, a thickness of the board 120 may be reduced. Also, without a core layer in the board 120 the board 120 may be easily bowed or deformed during an assembly process. However, the sub-board 160 reinforces the board 120 and may prevent deformation. The sub-board 160 will be described in further detail below.

At least one circuit element 140 is installed on a bottom surface of the board 120. The circuit element 140 may be a sensing circuit and a control circuit. For example, the circuit element 140 may be a driving integrated circuit (IC) chip (that is, an IC element). However, the present description is not limited thereto and the circuit element 140 may further include one or more passive elements.

The circuit element 140 is connected to the first circuit pattern 126 by a connection member 180. That is, the circuit element 140 is connected to the first circuit pattern 126, exposed by the opening 124a of the first insulating layer 124, through the connection member 180. The connection member 180 may be cylindrically shaped and may be made of copper. The connection member 180 is disposed in the opening 124a to compensate for a thickness of the connection member 180.

A through hole 162 is provided in the sub-board 160, and the circuit element 140 is disposed in the through hole 162. The through hole 162 has a thickness corresponding to a thickness of the circuit element 140.

Similar to the circuit element, the sub-board 160 is connected to the first circuit pattern 126 through additional connection members 180. That is, the sub-board 160 is connected to the first circuit pattern 126, exposed by additional openings 124a formed in the first insulating layer 124, by the connection members 180. The connection members 180 may be cylindrically shaped and may be made of copper. The connection members 180 are disposed in the openings 124a to compensate for a thickness of the connection member 180.

The sub-board 160 may have a ring shape and have a bottom electrode 164 on which solder may be provided. For example, a plurality of bottom electrodes may be formed in a row on the bottom of the annular sub-board 160. The sub-board 160 may have a thickness less than or equal to that of the circuit element 140, for example. The sub-board 160 may be a flexible circuit board or may be a printed circuit board (PCB) formed of a solid material. When the sub-board 160 is a PCB, the board 120 may be further supported by the sub-board 160, reducing the likelihood of deformation.

As mentioned above, an overall thickness of the fingerprint sensing device 100 may be reduced by reducing the thickness of the board 120 having the sensor array 122. That is, the thickness of the board 120 may be reduced by not having a core layer in the board 120. The overall thickness of the fingerprint device may be further reduced due to the sub-board 160 having a thickness corresponding to the thickness of the circuit element 140, the circuit element 140 and the sub-board 160 electrically connected to the board 120 through the connection members 180 instead of a bonding wire. In addition, since the sub-board 160 is connected to the board 120, bowing or deformation of the board 120 may be reduced.

Hereinafter, a fingerprint sensing device 200 according to another embodiment of the present disclosure will be described with reference to FIGS. 3 and 4.

Figure 3:
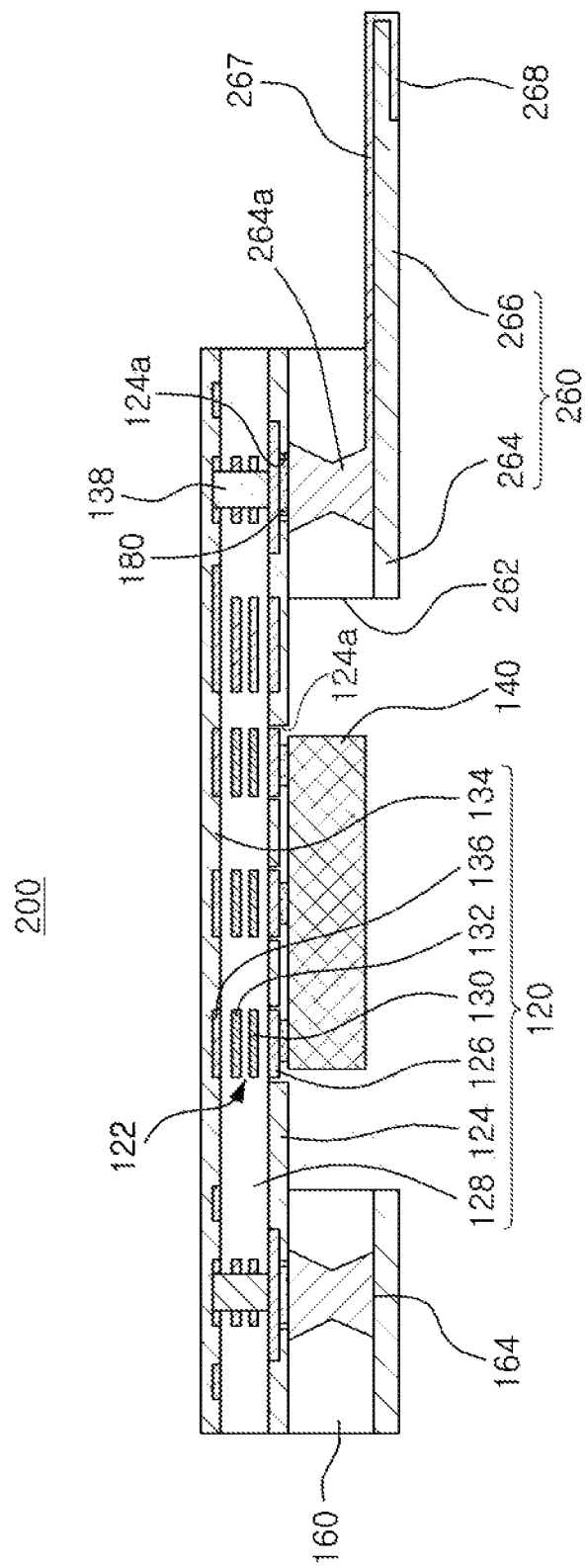
FIG. 3 is a schematic view illustrating a configuration of a fingerprint sensing device according to an embodiment.
Figure 4:
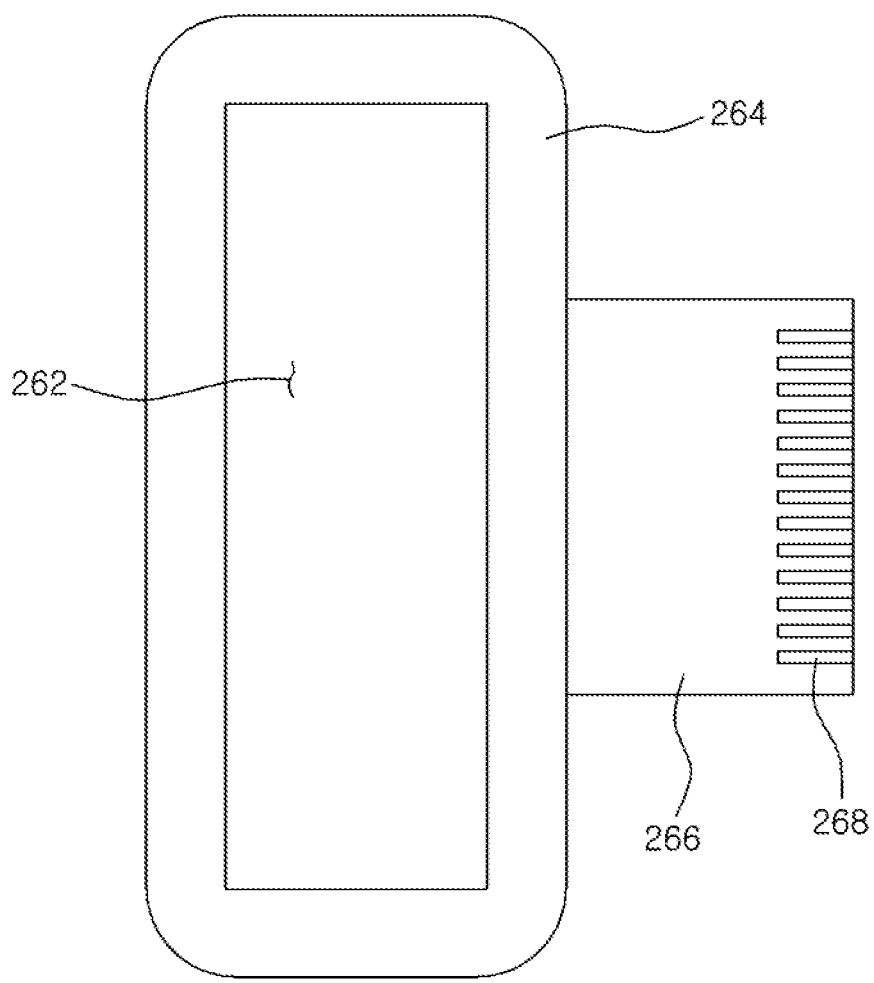
FIG. 4 is a bottom view illustrating a sub-board of a fingerprint sensing device according to an embodiment.

FIG. 3 is a schematic view illustrating a configuration of a fingerprint sensing device according to another embodiment, and FIG. 4 is a bottom view illustrating a sub-board of a fingerprint sensing device according to another embodiment.

Referring to FIGS. 3 and 4, a fingerprint sensing device 200 includes a board 120, a circuit element 140, and a sub-board 260, for example.

The board 120 has a sensor array 122. The sensor array 122 may be configured as a board-type fingerprint sensor formed on the board 120. The board 120 has a first insulting layer 124, a first circuit pattern 126, a base layer 128, a first electrode 130, a second electrode 132, a second insulating layer 134, and a second circuit pattern 136.

The first insulating layer 124 is disposed on a lower surface of the board 120 and formed of a solder resist layer. For example, the first insulating layer 124 may have a thickness of about 5 µm. Also, the first circuit pattern 126 is disposed in the first insulating layer 124 on the lower surface of the base layer 128, and openings 124a are formed in the first insulating layer 124 and expose portions of the first circuit pattern 126.

The first circuit pattern 126 is electrically connected to the circuit board 140 or/and the sub-board 260. The first circuit pattern 126 may have a thickness of about 0.2 µm.

The base layer 128 is disposed on the first insulating layer 124, and first and second electrodes 130 and 132 of the sensor array 122 are disposed in the base layer 128. The first electrode 130 is disposed in a lower portion of the base layer 128, as compared to a position of the second electrode 132. The first electrode 130 may include a plurality of first electrodes 130 extending along the lower portion of the base layer 128. The second electrode 132 is disposed in an upper portion of the base layer 128 as compared to the position of the first electrode 130. The second electrode 132 may include a plurality of second electrodes 132 extending along the upper portion of the base layer 128. That is, the first and second electrodes 130 and 132 are apart from one another at a predetermined interval in a thickness direction of the board 120.

For example, the plurality of first and second electrodes 130 and 132 are electrically separate and extend in directions perpendicular to one another. That is, the plurality of first and second electrodes 130 and 132 form a lattice pattern. In addition, a wiring pattern 138 connects an outer side of the plurality of first and second electrodes 130 and 132, and connects the plurality of first and second electrodes 130 and 132 to the first and second circuit patterns 126 and 136. For example, the first and second electrodes 130 and 132 may have a thickness of about 0.2 µm. The base layer 128 may have a thickness of about 10 µm.

The second insulating layer 134 is disposed on top of the base layer 128, and the second circuit pattern 136 is formed on the second insulating layer 134. Also, the second insulating layer 134 may be a solder resist layer. For example, the second insulating layer 134 may have a thickness of about 5 µm. The second circuit pattern 136 may have a thickness of about 0.2 µm.

The board 120 is a coreless board. Thus, a thickness of the board 120 may be reduced. Also, without a core layer in the board 120 the board 120 may be easily bowed or deformed during an assembly process. However, the sub-board 260 reinforces the board 120 and may prevent deformation. The sub-board 260 will be described in further detail below.

At least one circuit element 140 is installed on the bottom of the board 120. The circuit element 140 may serve as a sensing circuit and a control circuit. For example, the circuit element 140 may be a driving integrated circuit (IC) chip (that is, an IC element). However, the present disclosure is not limited thereto and the circuit element 140 may further include one or more passive elements.

The circuit element 140 is connected to the first circuit pattern 126 by a connection member 180. That is, the circuit element 140 is connected to the first circuit pattern 126 exposed by the opening 124a of the first insulating layer 124, through the connection member 180. The connection member 180 may be cylindrically shaped and may be made of copper. The connection member 180 is disposed in the opening 124a to compensate for a thickness of the connection member 180.

A through hole 262 is provided in the sub-board 260, and the circuit element 140 is disposed in the through hole 262. The through hole 262 has a thickness corresponding to a thickness of the circuit element 140.

Similar to the circuit element, the sub-board 260 is connected to the first circuit pattern 126 through additional connection members 180. That is, the sub-board 260 is connected to the first circuit pattern 126, exposed by additional openings 124a formed in the first insulating layer 124, by the connection members 180. The connection members 180 may be cylindrically shaped and may be made of copper. The connection members 180 are disposed in the openings 124a to compensate for a thickness of the connection member 180.

The sub-board 260 may have a ring portion 264 having an annular shape and an extending portion 266 extending from one end of the ring portion 264, and a connection terminal 268 configured to connect to a main board is formed in the extending portion 266. A via 264a connected to the connection member 180 is provided in the ring portion 264, and a circuit pattern 267 connecting the via 264a and the connection terminal 268 is disposed on the sub-board 260. Since the extending portion 266 is configured to connect to the main board, solder for installing the main board to the board 120 may be omitted. Therefore, an overall thickness of the main board and fingerprint sensing device may be reduced. In other words, since the main board is disposed below the fingerprint sensing device 200, an overall thickness of the fingerprint sensing device 200 may be reduced.

The sub-board 260 may have a thickness greater than or equal to that of the circuit element 140, for example. The sub-board 260 may be a flexible circuit board or a printed circuit board (PCB) formed of a solid material. When the sub-board 260 is a PCB, the sub-board 260 prevents the board 120 from bowing or deformation.

As mentioned above, an overall thickness of the fingerprint sensing device 200 may be reduced by reducing the thickness of the board 120 having the sensor array 122. That is, the thickness of the board 120 may be reduced by not having a core layer in the board 120. The overall thickness of the fingerprint device 200 may be further reduced due to the sub-board 260 having a thickness corresponding to the thickness of the circuit element 140, the circuit element 140, the sub-board 260 electrically connected to the board 120 through the connection members 180 instead of a bonding wire, and the extending portion 266 and the connection terminal 268 configured to be connected to a main board. In addition, since the sub-board 260 is connected to the board 120, bowing of the board 120 may be reduced.

As set forth above, according to the embodiments, the fingerprint sensing device may have a reduced thickness.

As a non-exhaustive example only, a device as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device capable of wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A fingerprint sensing device comprising:
a board having a sensor array;
a sub-board disposed on a bottom surface of the board;
a circuit element disposed on the bottom surface of the board; and
a through hole disposed through the sub-board,
wherein the circuit element is further disposed in the through hole,
wherein a thickness of the sub-board is substantially similar to a thickness of the circuit element,
wherein the sensor array comprises: a plurality of first and second electrodes disposed in a base layer,
wherein the plurality of first electrodes are disposed in a lower portion of the base layer, the plurality of second electrodes are disposed in an upper portion of the base layer, and the plurality of first and second electrodes are spaced apart from each other by a predetermined interval in a thickness direction of the board and extend in directions perpendicular to one another in the base layer.

2. The fingerprint sensing device of claim 1, wherein the sub-board has a circular shape and comprises a bottom electrode configured to receive solder.

3. The finger print sensing device of claim 1, wherein the sub-board comprises a circular ring portion and an extending portion extending from one end of the ring portion, wherein a connection terminal configured to connect to a main board is disposed on the extending portion.

4. The fingerprint sensing device of claim 3, wherein the sub-board further comprises
a via formed in the ring portion and
a circuit pattern connecting the via to the connection terminal.

5. The fingerprint sensing device of claim 1, wherein the circuit element and the sub-board are connected to the board through a connection member.

6. The fingerprint sensing device of claim 5, wherein the connection member is formed of copper.

7. The fingerprint sensing device of claim 1, wherein the board comprises:
a first insulating layer disposed on a lower surface of the base layer and
a second insulating layer disposed on an upper surface of the base layer.

8. The fingerprint sensing device of claim 7, wherein a first circuit pattern is formed between the first insulating layer and the lower surface of the base layer, and
a second circuit pattern is formed between the second insulating layer and the upper surface of the base layer.

9. The fingerprint sensing device of claim 8, wherein an opening in the first insulating layer exposes a portion of the first circuit pattern, and
the circuit element and the sub-board are connected to the portion of the first circuit pattern.

10. A fingerprint sensing device comprising: a sensor array disposed in a base layer of a board; a sub-board disposed on the board, wherein the sub-board comprises a through hole; and a circuit element disposed in the through hole and on the board, wherein a thickness of the circuit element is substantially the same as a thickness of the sub-board, wherein the sensor array comprises a plurality of first electrodes and a plurality of second electrodes disposed in the base layer, wherein the board comprises: a first insulating layer, the base layer disposed on the first insulating layer, and a second insulating layer disposed on the base layer, wherein a first circuit pattern is disposed between the first insulating layer and the base layer, and a second circuit pattern is disposed between the base layer and the second insulating layer, wherein the sub-board comprises: a ring portion having an annular shape and an extending portion extending from one end of the ring portion, and a connection terminal configured to connect to a main board disposed on the extending portion.

11. The fingerprint sensing device of claim 10, wherein the circuit element and the sub-board are connected to the first circuit pattern and the second circuit pattern through a connection member, and the connection member is disposed within an opening formed in the first insulating layer.

12. The fingerprint sensing device of claim 10, wherein the sub-board has an annular shape and a bottom electrode configured to receive solder.

13. The fingerprint sensing device of claim 10, further comprising:
a connection member connecting the first and second circuit patterns to the connection terminal.

14. The fingerprint sensing device of claim 13, wherein a via connects the connection member to the connection terminal.

15. The fingerprint sensing device of claim 14, wherein a circuit pattern connects the via to the connection terminal.

16. The fingerprint sensing device of claim 10, wherein the circuit element is an integrated circuit driving chip.

17. The fingerprint sensing device of claim 10, wherein the sub-board comprises:
a printed circuit board configured to prevent bowing of the board.

18. A fingerprint sensing device comprising: a sensor array disposed in a base layer of a board; a sub-board disposed on the board, wherein the sub-board comprises a through hole; and a circuit element disposed in the through hole and on the board, wherein a thickness of the circuit element is substantially the same as a thickness of the sub-board, wherein the sensor array comprises a plurality of first electrodes and a plurality of second electrodes disposed in the base layer, wherein the board comprises: a first insulating layer, the base layer disposed on the first insulating layer, and a second insulating layer disposed on the base layer, wherein a first circuit pattern is disposed between the first insulating layer and the base layer, and a second circuit pattern is disposed between the base layer and the second insulating layer, wherein the plurality of first electrodes are disposed in a lower portion of the base layer, the plurality of second electrodes are disposed in an upper portion of the base layer, and the plurality of first and second electrodes are spaced apart from each other by a predetermined interval in a thickness direction of the board and extend in directions perpendicular to one another in the base layer.

* * * * *